United States Patent [19]

Schaffner et al.

[11] Patent Number: 4,916,015

[45] **Date of Patent: * Apr. 10, 1990**

[54] HEAT DISSIPATION MEANS FOR X-RAY GENERATING TUBES

[75] Inventors: Donald R. Schaffner, Mission Viejo; Donald H. Leeds, Rolling Hills, both of Calif.

[73] Assignee: The B.F.Goodrich Company, Akron, Ohio

[ * ] Notice: The portion of the term of this patent subsequent to Aug. 18, 2004 has been disclaimed.

[21] Appl. No.: 45,495

[22] Filed: May 4, 1987

Related U.S. Application Data

[62] Division of Ser. No. 653,629, Sep. 24, 1984, Pat. No. 4,688,239.

[51] Int. Cl.[4] .......... B32B 9/00; H01J 35/10; C23C 14/00

[52] U.S. Cl. .......... 428/408; 378/141; 204/157.47; 204/192.34; 204/192.35

[58] Field of Search .......... 428/408, 688; 427/38; 204/157.47, 192.34, 192.35

[56] References Cited

U.S. PATENT DOCUMENTS

| | | | |
|---|---|---|---|
| 4,349,424 | 9/1982 | Sovey et al. | 204/192.34 |
| 4,521,442 | 6/1985 | Guarnieri | 427/38 |
| 4,600,659 | 7/1986 | Hong et al. | 204/192.15 X |
| 4,607,193 | 8/1986 | Curren et al. | 204/192.15 X |
| 4,688,239 | 8/1987 | Schaffner et al. | 378/142 X |

OTHER PUBLICATIONS

Rizk and Holland, "Sputtering and Chemical Etching of Carbon in a DC Glow Discharge", Vacuum, vol. 27, Nos. 10/11, pp. 601–604.

*Primary Examiner*—George F. Lesmes
*Assistant Examiner*—Susan S. Rucker
*Attorney, Agent, or Firm*—W. W. Ban; D. M. Ronyak

[57] ABSTRACT

An improved X-ray generating tube having anode and cathode, the anode being a target track assembly rotatably mounted upon a shaft within a tube and including a plurality of pyrolytic graphite fins configured to accept heat from the target and to transfer the heat to a point external to the X-ray tube.

1 Claim, 6 Drawing Sheets

HEAT DISSIPATION MEANS FOR X-RAY GENERATING TUBES

This is a division, of application Ser. No. 06/653,629 filed 9-24-84 U.S. Pat. No. 4,688,239.

FIELD OF THE INVENTION

This invention relates to radiation emitting devices generating radiation by high energy electrical bombardment of a substance capable of emitting a radioactive particle under such bombardment, and more specifically to means for dissipating heat generated during the generation of radiation in such devices. Particularly, this invention relates to so-called X-radiation generating tubes and to means for dissipating heat evolved during the generation of X-radiation in most tubes. Most particularly, this invention relates to such X-radiation tubes employed in so-called cat-scanning machines and similar medical devices and to means for dissipating heat evolved during the generation of X-radiation suitable for use in such machines.

BACKGROUND OF THE INVENTION

X-rays are a penetrating electromagnetic radiation typically generated by accelerating electrons to an elevated velocity and suddenly stopping those electrons by means of collision with a solid body. X-rays may also be generated by inducing innershell electron transitions in atoms having atomic numbers greater than about 10. X-rays are typically possessed of wave lengths from about 0.06 to about 120 angstroms and may also be know as roentgen rays.

X-rays have found substantial utility in providing pictures of objects otherwise normally concealed from sight to the human eye. Most particularly, X-rays have found great utility in the medical industry where, because of differences in the relative opacity of various portions of internal organs and structures of the human body, the projection of X-rays through the body onto an electromagnetic sensitive film can produce a representation of the shape and form of the structures within the body. Depending upon the angular positioning of an X-ray generator and the film with respect to the body, and upon making repeated film exposures at a plurality of such angles a 3-dimensional view of these body structures can be achieved. Computers find utility in enhancing such views.

X-ray devices employed particularly in the medical field generally utilize X-rays generated by a vacuum tube or so-called X-ray tube configured to produce X-rays by accelerating electrons to an elevated velocity by means of an electrostatic field and then suddenly stopping those electrons by collision with an interposed target. The operation of such an X-ray tube generates a significant quantity of heat, the dissipation of which is hindered by the inherently non heat conducting nature of a vacuum tube. Where, as in early medical X-ray devices, only single so-called shots or photographic X-ray images were taken at times somewhat separated one from the next, the accumulation of heat generated by the operation of an X-ray tube did not substantially interfere with the routine operation and use of such X-ray machines. More recently, however, X-ray medical devices have been developed wherein it is desired that a considerable number of X-ray photographs be taken at varying angles with respect to the body in a relatively short period of time. In these devices, such as so-called cat-scanners, one limitation upon the rapidity with which X-ray photographic images may be obtained from the cat-scanner is the dissipation of heat that builds up within the X-ray tube during generation of X-rays for producing such X-ray cat-scan photographs.

One factor contributing to the relatively slow dissipation of heat from X-ray tubes is the basic configuration of the tube. Typically, such tubes are formed as a glass or glass-like envelopes of generally cylindrical configuration, the interior of which is normally evacuated to a vacuum of between $10^{-6}$ and $10^{-7}$ torr.

Within the envelope a cathode typically is positioned in electrical communication with a source of relatively elevated electrical potential position generally external to the envelope. Also located within the envelope is typically a so-called target and track assembly generally formed as a disk oriented approximately perpendicularly to a longitudinal axis of the envelope. The disk like target includes generally a track adhered to the target typically adjacent an outward circumferential edge and oriented in a direction generally facing the cathode. As a result of the track being offset from a central axis of the envelope, the cathode is generally oriented at a position within the envelope facing the track but offset from a longitudinal axis of the envelope.

The target and track assembly is typically supported within the envelope employing a shaft which protrudes through the envelope to a connection with the source of electrical potential and to a drive means for rotating the shaft and thereby rotating the target and track assembly within the envelope. Where the shaft passes through the envelope, the shaft is typically supported and spaced from the envelope by bearings; these bearings typically also function to maintain a vacuum within the envelope. Such bearings generally have a service temperature limitation of between approximately 200°-300° C.

The envelope including cathode and target track assembly typically is contained within a canister including dielectric oil at least partially filling the canister. The canister includes a beryllium "window" through which X-radiation may exit the envelope and surrounding canister for use in performing X-ray functions.

Typically, heat arising from the electromagnetic generation of X-rays accumulates in the target of the X-ray tube. Heat may be eliminated from the target by either radiation through the vacuum tube and into the dielectric oil or by thermal conductance along the shaft to a point external to the vacuum envelope. As the shaft typically is of relatively elongated axial length relative to its cross-sectional area, conductance along the shaft has not generally proved to be an effective and efficient means for removing heat from the cathode ray tube. Further, should the shaft become heated to a point exceeding about 200° C. in dissipating heat acquired from the target, the bearing supporting the shaft at the shaft passage through the envelope could suffer deleterious consequences. Likewise, radiation of heat from the target track assembly of the X-ray tube has proven less than satisfactory in dissipating the heat evolved by the generation of X-rays. One factor contributing to less than satisfactory by heat dissipation radiation has been the relatively small surface area available at the target for radiation of heat. Further, such target areas are generally formed of a metal alloy such as so-called TZM alloy, an alloy of titanium, zirconium and molybdenum. Such metal alloys typically have a relatively low surface emissivity constant which typically exerts a depressing effect upon the quantity of heat which can be rejected from the target by radiation per unit of time.

It has been suggested that a fine grain carbon be applied in laminate manner to the TZM target to provide a larger heat reservoir and an expanded surface area for radiation of heat. Such proposals, however, have not satisfactorily addressed the ultimate difficulty in providing an X-ray tube capable of a substantial throughput, that is a relatively large number of X-ray discharges from the tube during a relatively brief period of time. Such a capacity requires a large step change rather than an incremental change in the capability for the X-ray tube to reject heat evolved during the generation of X-rays. Small step changes in the capability for the X-ray tube to accumulate heat and provide for its rejection do not satisfactorily provide for large increases in the number of X-ray discharges required from the X-ray tube per unit of time. Were an X-ray tube available having the capability for rejecting relatively large quantities of heat per unit of time, such tubes employed in the generation of X-rays for industries and science could substantially boost productivity where X-rays are used for the performance of necessary tasks in these industries.

DISCLOSURE OF THE INVENTION

The present invention provides an improvement to devices for emitting electromagnetic radiation having a cathode and a target track assembly including a support for the target track assembly all contained within a sealed envelope, with the support extending through the envelope, and providing for rotation of the target track assembly, and including a means for extracting heat from the assembly and dissipating the heat. The improvement comprises a plurality of pyrolytic graphite fins affixed to the assembly and configured to accept heat from the assembly and to transmit heat to a heat-acceptor. The fins, depending upon the preferred embodiment, may be disk-like and oriented in planes perpendicular to a longitudinal axis of the envelope, may be axial fins oriented in a plane generally parallel to a longitudinal axis of the envelope, or may be cylindrically configured fins mounted to be generally parallel with a longitudinal axis of the envelope. The fins may be configured either to radiate heat through the walls of the envelope to a heat-acceptor by providing an enhanced radiation surface or may be configured to conduct and/or radiate heat to a point where that heat may be transferred to a heat-acceptor such as an oil reservoir or a fluid-cooled shaft supporting the target track assembly.

In certain preferred embodiments, the tube includes second fins interleaved with the pyrolytic graphite fins and configured to conduct heat radiated from the pyrolytic graphite fin to the second fin and then onward to a heat-acceptor. The second fins are generally configured to be stationary within the envelope while the pyrolytic graphite fins are generally configured for rotational motion.

Where the heat is dissipated from the envelope by radiation from the pyrolytic graphite fins, typically the fins will be possessed of a surface emissivity of at least 0.90.

Other features and advantages of the invention will become more apparent when considered in light of a description of a preferred embodiment and drawings which together form a part of the specification.

Figures 3, 36:
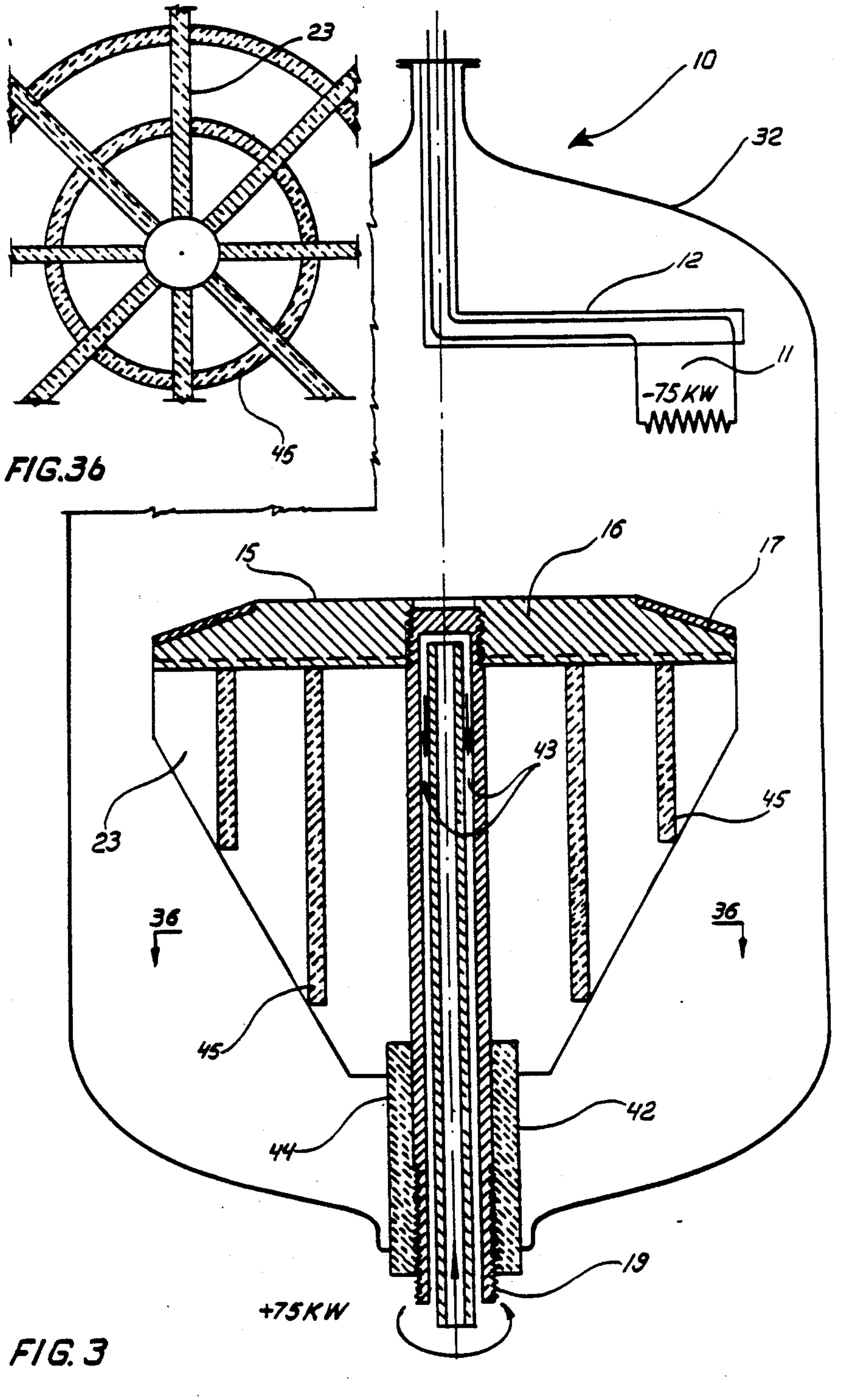
FIG. 3 is a side elevational view partially in cross section of an X-ray vacuum tube made in accordance with the invention.

FIG. **3*b* is a view taken along line 3*b* in FIG. 3**.

Figures 4, 46:
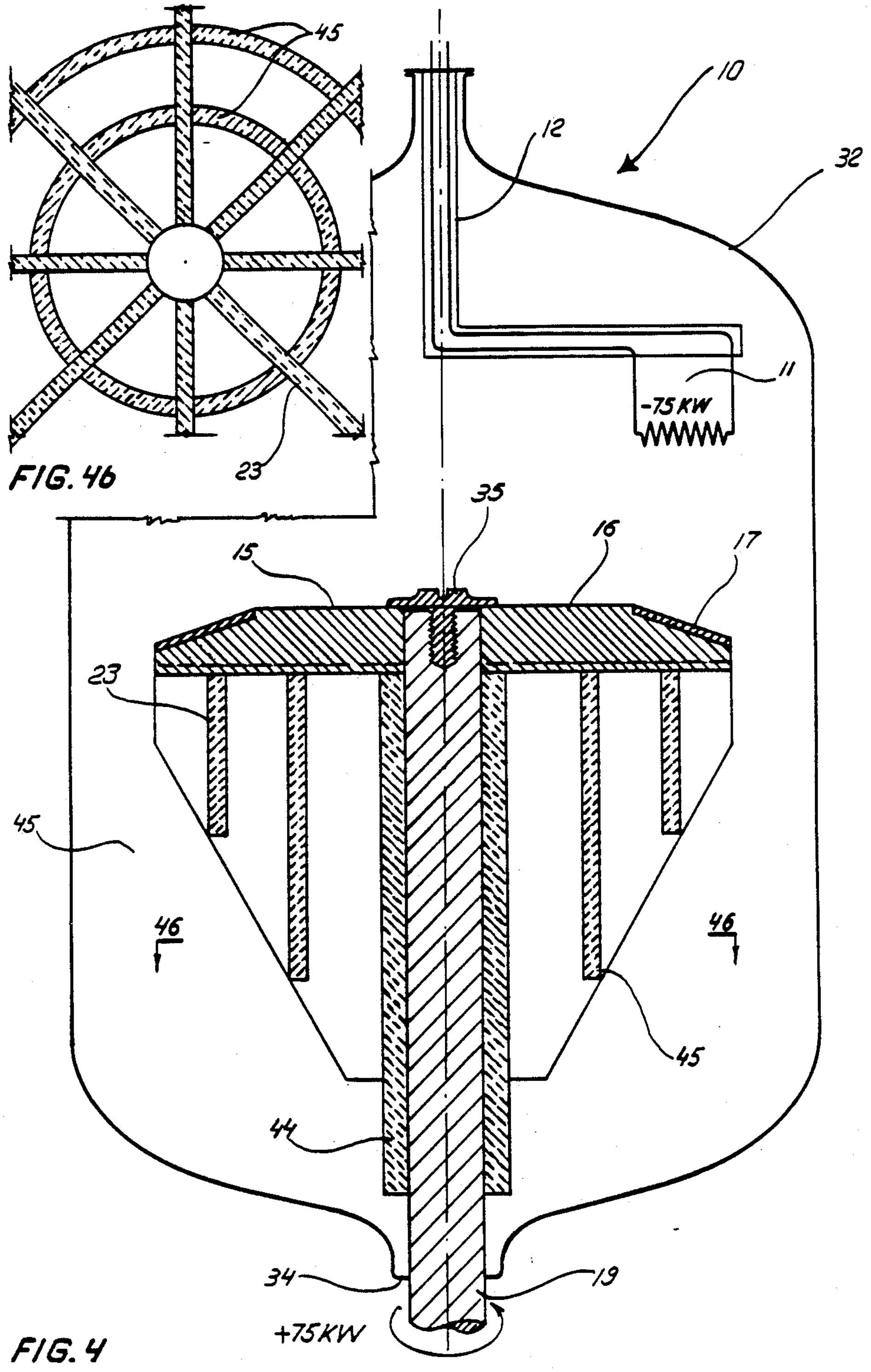

FIG. 4 is a side elevational view partially in cross section of an X-ray vacuum tube made in accordance with the invention.

FIG. **4*b* is a view taken along line 4*b* in FIG. 4**.

Figure 5:
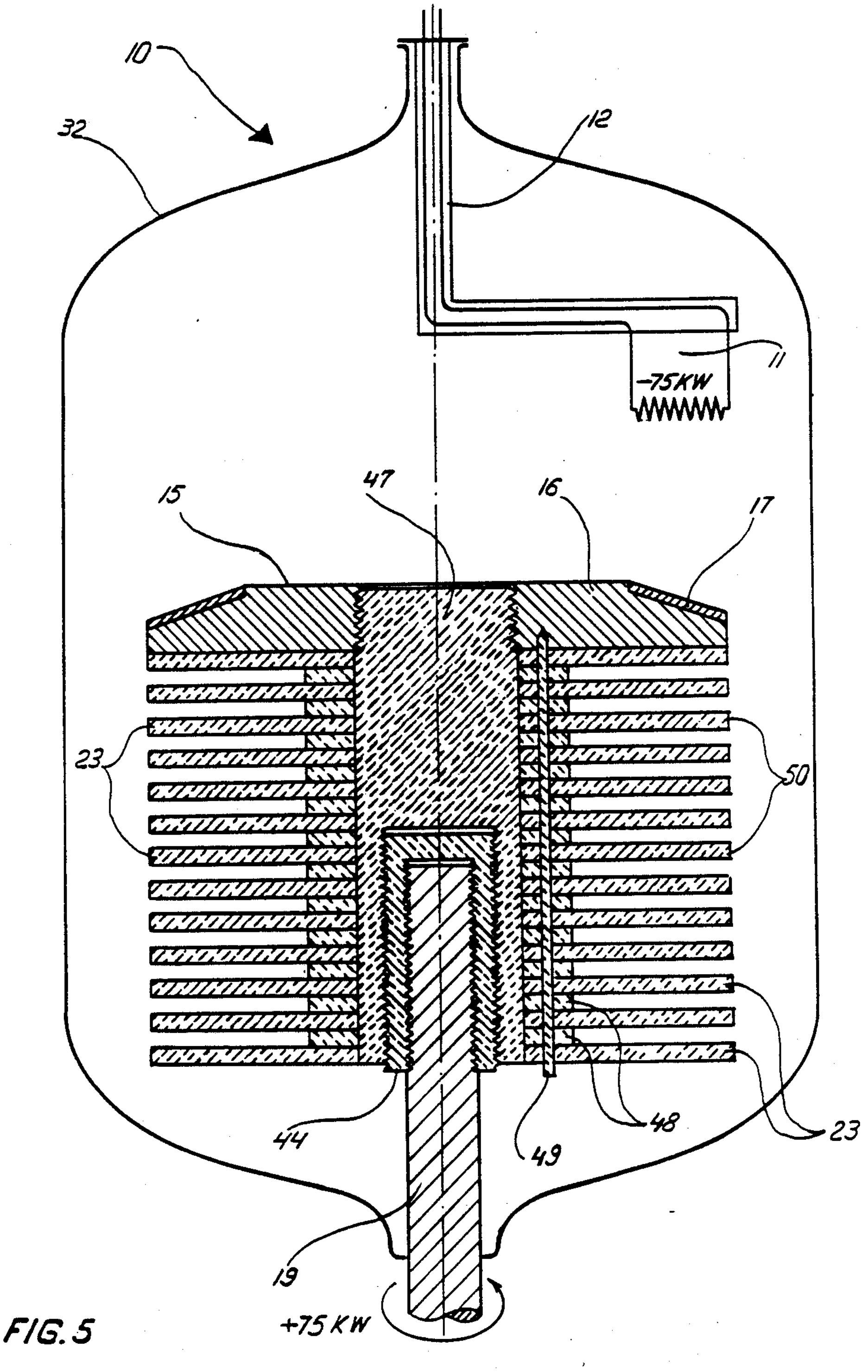

FIG. 5 is a side elevational view partially in cross section of an X-ray vacuum tube made in accordance with the invention.

Figure 6:
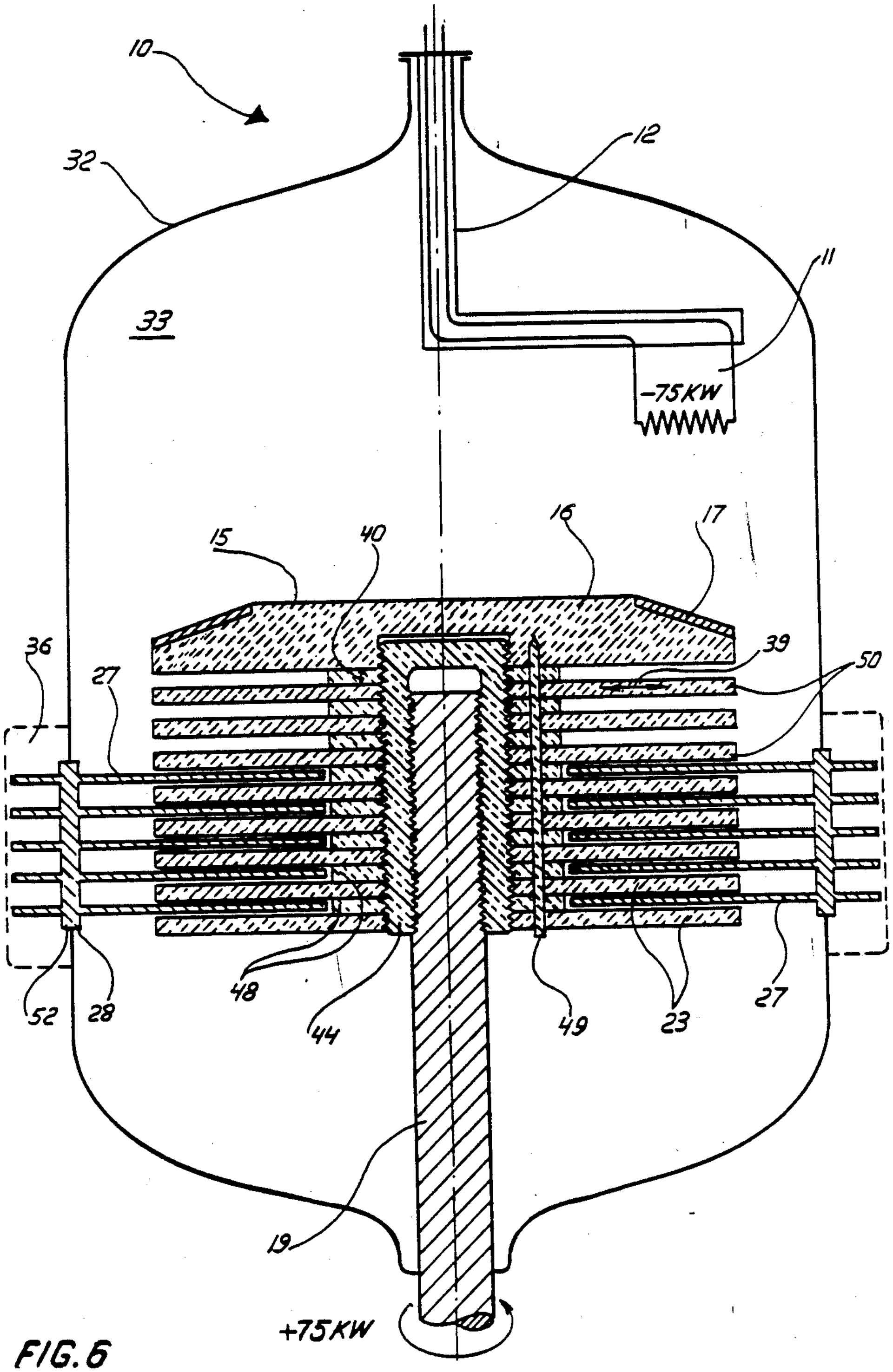

FIG. 6 is a side elevational view partially in cross section of an X-ray vacuum tube made in accordance with the invention.

BEST EMBODIMENT OF THE INVENTION

The present invention provides an improved X-radiation generating tube having substantially enhanced heat rejection capabilities. The X-ray tube of the present invention is particularly advantageously applied to the generation of X-radiation in applications where the frequency with which such radiation is utilized in the performance of work tasks exceeds the output capability of older X-ray tubes having traditional capabilities for heat dissipation. The X-ray generation tube of the present invention finds particular utility in the operation of so-called cat-scanning machines.

Figure 1:
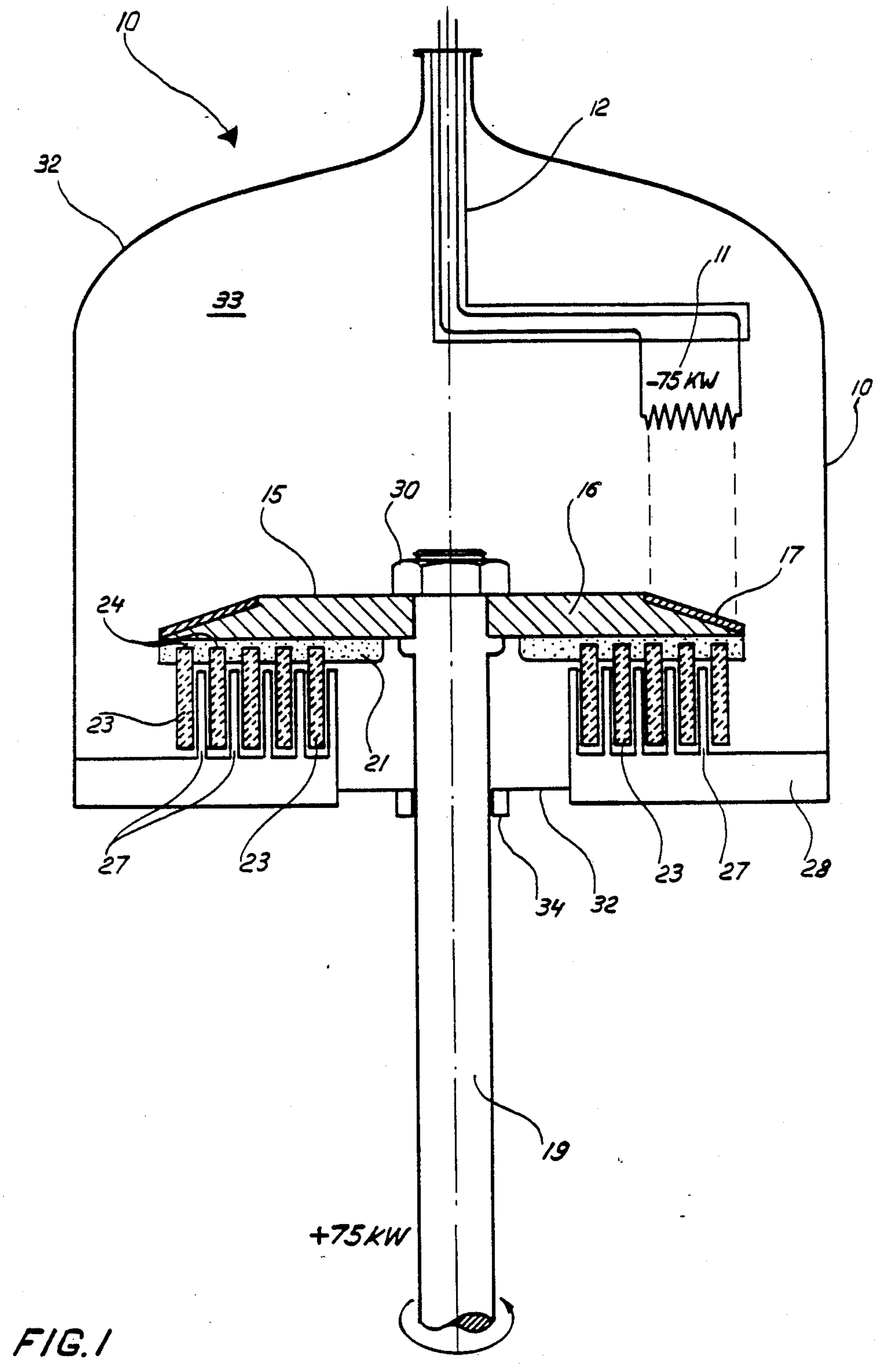
FIG. 1 is a side elevational view partially in cross section of an X-ray vacuum tube made in accordance with the invention.

Referring to the drawings, FIG. 1 depicts an X-radiation tube 10. The tube 10 includes a cathode 11 and a rigid support 12 for the cathode, the rigid cathode support 12 functioning also to transmit electrical potential from a source (not shown) to the cathode 11. A target track assembly 15 is provided within the tube. The target track assembly 15 includes a target 16 and a track 17 positioned upon the target. The target track assembly 15 typically is circularly disk-like in configuration. A shaft 19 rotatably supports the target track assembly 15 within the tube.

The shaft 19 is configured for rotation whereby the supported target track assembly 15 can be rotated within the tube 10. The shaft 19 can be rotated employing any suitable or conventional means for shaft rotation, and such means are therefore not shown in the drawings.

A heat pad 21 is affixed to the target 16 for assisting in dissipation of heat from the target track assembly 15. The heat pad 21 is not required in the implementation of the instant invention where the target is formed from pyrolytic graphite, but generally is, employed with non-pyrolytic targets to provide for accumulating surges of heat and to assist in the transfer of heat away from the target track assembly 15.

A plurality of fins 23 are provided, the fins 23 being affixed to the target track assembly 15. The fins may be affixed to the target track assembly by any suitable or conventional means such as by the use of adhesives, grooving techniques commonly known as rabbeting, threaded graphite screws, carbon infiltration, and combinations thereof. Particularly, in preferred embodiments the fins are attached employing adhesive C-34 manufactured by Union Carbide (a furfuryl based adhesive) followed by impregnation with pyrolytic carbon. The fins 23 may be press fitted into grooves or fitted to dovetails configured to provide a snug fit. It is much preferred that the fins 23 be cemented into rabbeted grooves formed in the heat pad 21 or formed in the target track assembly 15. The use of rabbeted notches 24 improves the strength of any adhesive joinder between the fins 23 and the heat pad 21 or the target track assembly 15.

The fins 23 are typically formed from pyrolytic graphite. Graphite is a mineral consisting of a low pressure allotropic form of carbon. Pyrolytic graphite is a graphite generally resulting from the pyrolytic conversion of natural gas or methane at about 2000° C. and below about 100 millimeters mercury pressure (absolute) or as better known in the trade, 100 millimeters Hg vacuum. Techniques for the manufacture of pyrolytic graphite are well known.

In FIG. 1, the pyrolytic graphite fins are formed as cylinders and are attached to the target track assembly 15 coaxially together with the shaft 19.

A second set of cylindrical fins 27 are provided, configured to be interleaved between the fins 23. By virtue of co-axial attachment of the fins 23 and the shaft 19 to the target track assembly, rotation of the target track assembly and consequent rotation of the fins 23 does not engender any interference or collision with the fins 27.

The fins 27 may be made of any suitable or conventional heat conducting material such as a heat conducting metal like copper or beryllium or may be fabricated from graphite, pyrolytic graphite or pyrolytic carbon according to known techniques. The fins 27 are joined to a heat-acceptor 28 which, in the embodiment of FIG. 1, is a metallic plate or a plate of graphite, pyrolytic graphite or pyrolytic carbon. The plate 28 accepts heat by conductance from the fins 27 and provides for dissipation of the heat external to the tube 10.

Typically, a clearance between the fins 23 and the fins 27 of at least 0.010 centimeters or greater is maintained. Since heat is transferred between the fins 23 and the fins 27 by means of radiation, it is desirable that this inter fin clearance be maintained relatively small, and that the fins 23 be possessed of a relatively elevated surface emissivity. By emissivity what is meant is the ratio of the radiation emitted by the particular surface to the radiation emitted by a perfect black body radiator at the same temperature. The term surface emissivity may also be known as normal emissivity. The surface emissivity for the fins 23 of the present invention preferably exceeds 0.90.

The target track assembly is retained on a shaft employing any suitable or conventional retaining means such as a shaft nut 30 threadably engaging the shaft 19. Alternately: the assembly 15 can be retained upon the shaft 19 employing screws; the assembly 15 can be threaded onto the shaft with the threads preferably being configured to cause a tightening of the threaded joinder between the assembly 15 and the shaft 19 during rotation, or the assembly 15 may be cemented to portions of the shaft 19.

Typically the target track assembly 15 is electrically charged oppositely from the cathode 11. The shaft 19 generally is configured to connect a source of electrical potential with the target track assembly 15. Any joinder between the shaft 19 and the target track assembly 15 should be one sustaining electrical continuity therebetween.

The outer confines of the X-ray tube 10 are defined by an envelope or shield 32 which sealingly surrounds the X-ray tube 10. The envelope is typically formed from a glass material but may be formed from any suitable or conventional material which will not substantially interfere with the transmission of X-rays therethrough. The interior of the tube, designated generally at 33 in FIG. 1, is evacuated to a vacuum of typically between $10^{-6}$ and $10^{-7}$ torr. In order that the vacuum within the X-ray tube be maintained, it is necessary that the point at which the shaft enters the X-ray tube, designated generally at 34 in FIG. 1, be sealed in a bearing configuration whereby the shaft 19 and the envelope 32 are supportingly spaced apart, one from the other. A number of well-known suitable bearing techniques exist for sealing the intersection 34 between the shaft 19 and the tube 32, and therefore the specific details of such seals have been omitted from the drawings.

The target is typically formed from titanium-zirconium-molybdenum (TZM) alloy metal. As this TZM is quite expensive and so, substitute materials such as pyrolytic graphite or very fine-grained bulk graphite may be employed in lieu of the TZM. TZM is commercially available. Bulk fine-grained graphites are available, for example, from Carbone Lorraine Industries.

The track typically is an alloy of tungsten and rhenium. Suitable compositions of metals for forming the track are well known in the art for producing desired X-rays. The track material is generally applied to the TZM or bulk graphite target by vapor deposition or molten salt electro deposition. Such techniques also are well known in the art.

The heat pad 21 typically is formed from fine grain graphite such as is available from the aforementioned Carbone but may also be formed from pyrolytic graphite. Because the presence of carbon dust within the vacuum X-ray tube can be disfunctional to the generation of X-rays, it is preferable that carbonaceous materials selected for making the heat pad as well as the target be possessed of extremely low dust forming characteristics. One aspect of this invention minimizes dusting.

It should be apparent in the embodiment of FIG. 1 that heat evolved during the generation of X-radiation within the X-ray tube 10 is transferred from the track to the target and thence to the heat pad 21 from which the heat is conducted through the fins 23 and radiated to the fins 27 for conductance to the heat-acceptor 28. Heat is removed from the heat-acceptor 28 in any suitable or conventional manner such as by immersing the X-ray tube in a dielectric oil within a container having a beryllium window permitting exit of the generated X-rays from the dielectric oil containing device.

Figure 2:
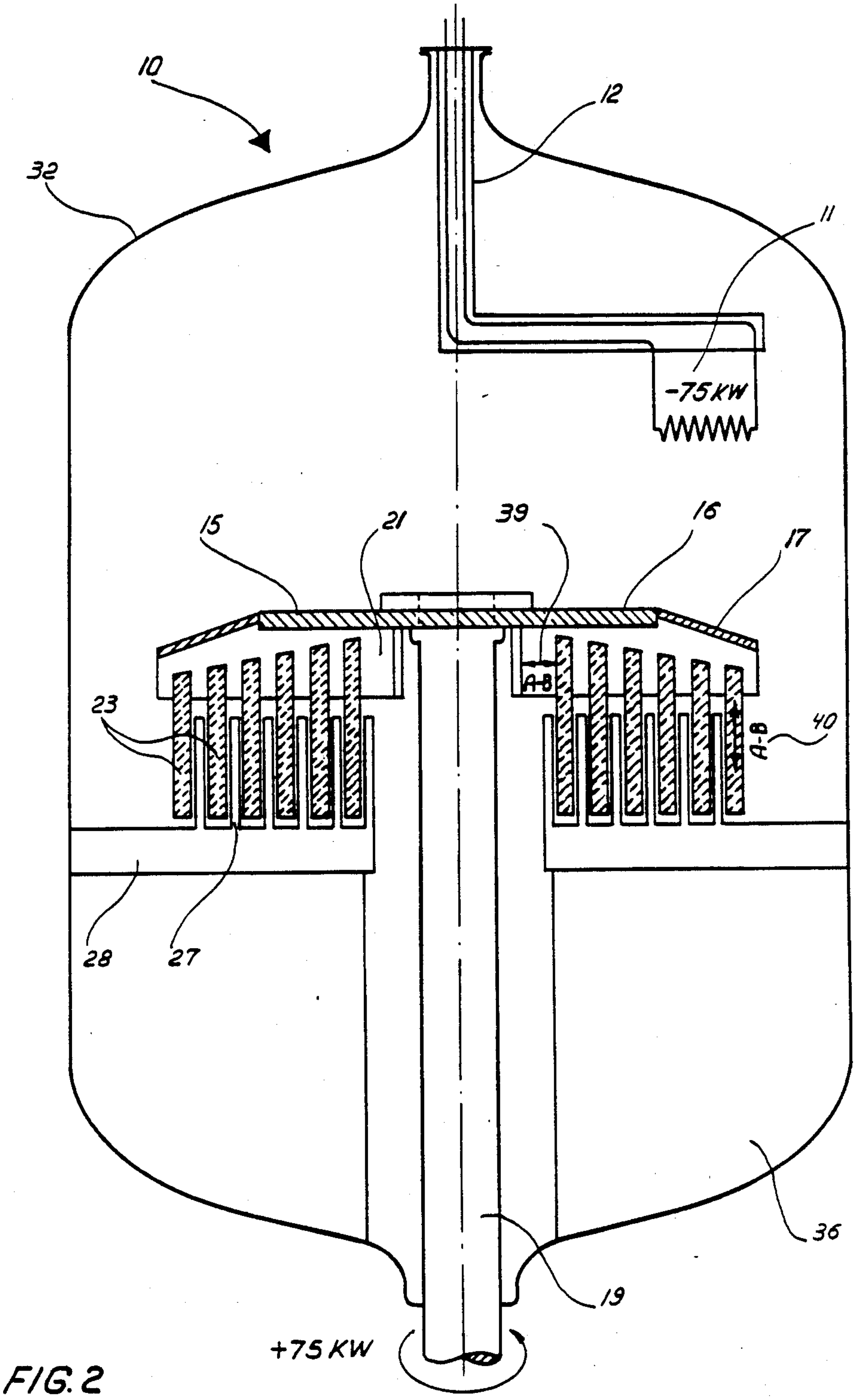
FIG. 2 is a side elevational view partially in cross section of an X-ray vacuum tube made in accordance with the invention.

Referring to the drawings, FIG. 2 depicts an alternate and equally preferred embodiment of the instant invention wherein an X-ray tube 10 includes a cathode 11 and a cathode support 12 as in FIG. 1. A target track assembly 15 is affixedly positioned to a shaft 19 and includes a target 16 and a track 17. The target track assembly 15 includes a heat-pad 21 and fixed fins 23. Fins 27 are provided in interleaved configuration with the fins 23 and the fins 27 are affixed in heat conducting relationship to a heat-acceptor 28. The target track assembly is joined to the shaft 19 employing a threaded member 35 engaging the shaft.

In the embodiment of FIG. 2, the target is again made from a TZM alloy, and the track is again a rhenium-tungsten deposited metal surface. The heat-pad 21 is comprised of pyrolytic graphite as are the fins 23. The fins 27 and the heat-acceptor 28 are comprised of a conductive metal such as copper, or beryllium or are formed from a graphite substance such as pyrolytic graphite. An oil pool 36 is contained within the X-ray tube 10 and functions to remove heat from the heat-acceptor 28 for eventual radiation into the environment. The oil employed in the oil pool 36 can be any suitable oil, much preferably dielectric oil. Such suitable oils are well known in the art of X-ray equipment manufacture.

As is well known in the art relating to graphite, and particularly to pyrolytic graphite, a pyrolytic graphite substance conducts heat substantially more efficiently along certain orientations of a grain structure of the pyrolytic substance as opposed to along remaining orientations of the grain structure. The direction of substantially more efficient heat transfer is typically known as the A-B orientation. By careful positioning of the A-B orientation in forming particular fin 23 and heat-pad 21 structures for use in the instant invention, heat transfer from the target track assembly 15 can be substantially enhanced. For example, in forming the heat-pad 21 of FIG. 2, the A-B direction is aligned in accordance with the arrow 39 to move heat relatively rapidly to the fins 23. In forming the fins 23 of FIG. 2 from pyrolytic graphite, orientation of the A-B direction as indicated by the arrow 40 configures the fins 23 to move heat efficiently and in relatively large quantity along the fin 23 and away from the heat-pad 21.

Pyrolytic graphite suitable for use in the instant invention can be made in accordance with practices well known in the art. From time to time, however, it is desirable that the surface of the pyrolytic graphite fins 23 be possessed of an elevated surface emissivity. An elevated surface emissivity assists in radiation of heat from the fins. While the surface emissivity or emittance of pyrolytic graphite is typically between about 0.50 and 0.80, an elevated surface emissivity may be achieved by etching the surface of the pyrolytic graphite. Etching can be achieved employing conventional chemical etching techniques previously known and employed for etching carbon or, preferably by ion bombardments employing accepted bombardment techniques. Particularly, bombardment employing ions generated by exciting Argon gas is preferred in the practice of the instant invention.

Surface emissivity may also be enhanced by infiltrating bulk graphite with a sub surface coating of carbon. Infiltration can be accomplished in any suitable or conventional manner, and such techniques are well known in industry performing carbon infiltration services. Typically, carbon is infiltrated into pyrolytic graphite to provide an infiltration zone of approximately 30–40 mils in thickness and a surface coating of approximately 3 mils in thickness. So called CVD carbon has also been found useful for suppressing dusting. Infiltrating the fins 23 in the practice of the instant invention may be accomplished by vapor deposition techniques at a temperature not exceeding about 2300° F. in accordance with conventional techniques. After deposition of the carbon, the surface of the fin may be etched employing well-known conventional chemical etching techniques or the like or other suitable etching techniques to further enhance surface emissivity.

Referring to the drawings, FIG. 3 is a representation of a further preferred embodiment of an X-ray tube having the enhanced heat dissipation capabilities of the instant invention. The tube 10 again includes a cathode support 12 and a cathode 11, together with a target track assembly 15 including a target 16 and a track 17. Fins 23 are arranged within the tube 10 in an axial configuration, that is in a plane parallel to a longitudinal axis of the shaft 19. The shaft 19 includes internal passageways 42, 43, through which coolant may be circulated for removing heat from the X-ray tube 10. The fins 23 are supported by the target track assembly 15 and by an insulating sleeve 44. The sleeve 44 may be made of any suitable high temperature insulating material such as boron nitride.

The fins 23 preferably are in direct contact with the shaft 19 so that heat may be transferred by conductance between the fins 23 and the shaft 19. Contact between the fins 23 and the shaft 19 may be enhanced by the use of cements in a manner similar to the use of cements in attaching the fins 23 to the heat-pad 21 in FIGS. 1 and 2, and particularly heat conductive cements. One or more support rings 45 may be employed to stabilize the fins 23 and space the fins 23 one from the other during rotation of the target track assembly 15. Typically, the stabilizer rings 45 are formed from pyrolytic graphite.

The fluid employed for cooling the shaft can be any suitable or conventional liquid or gas coolant. Water is much preferred except in environments where freeze/-thaw cycles are likely.

The target track assembly 15 in FIG. 3 threadably engages the shaft 19 whereby the target track assembly 15 and the shaft 19 are joined for rotation. It is preferred that the threadable innerconnection between the target track assembly 15 and the shaft 19 be configured so that upon rotation of the shaft, the threadable innerconnection is tightened by inertial forces.

Referring to the drawings, FIG. 4 depicts a further preferred embodiment of the heat dissipating X-ray tube 10 of the instant invention. Again a cathode support 12 and a cathode 11 are contained within an X-ray tube 10 surrounded by an envelope 32. Also contained within the envelope 32 is a target track assembly 15 including a target 16 and a track 17 affixed to a shaft 19 and including fins 23. The fins 23 are positioned axially with respect to an axis of the shaft 19.

The shaft 19 in FIG. 4 is not fluid-cooled. To protect against heat transference from the fins 23 to the shaft 19 thereby potentially injuring the bearings (not shown) at the point 34 where the shaft 19 passes through the envelope 32, an insulator sleeve 44 extends from a point adjacent the target track assembly 15 to a point beyond which the fins 23 no longer would otherwise contact the shaft 19 but for the intervention of the insulator sleeve 44. The fins 23 are configured generally in accordance with the fins 23 of FIG. 3 and may include pyrolytic graphite spacer rings 45. The fins 23 in FIG. 4 are adhered to the target track assembly 15 and the shaft insulator 44 in any suitable or conventional manner such as by the use of cement. The target track assembly is retained upon the shaft 19 employing a screw 35.

Referring to the drawings, FIG. 5 depicts a further preferred embodiment of the instant invention wherein a cathode support 12 and cathode 11 are contained within an X-ray tube 10 surrounded by an envelope 32. Also contained within the envelope 32 is a target track assembly 15, including a target 16 and a track 17. A heat-accumulator 47 surroundingly engages a insulator sleeve 44 which insulator sleeve 44 correspondingly surroundingly engages a shaft 19. The target track assembly 15 is attached to the heat-accumulator 47. Attachment between the heat-accumulator 47 and the target track assembly 15, as well as between the heat-accumulator 47 and the insulator sleeve 44 and between the insulator sleeve 44 and the shaft 19 can be accomplished using suitable conventional techniques such as adhesives and/or screw threading. Where screw threading is employed, it is preferred that the screw threads be configured so that rotation of the shaft 19 causes a tightening of the screw thread joints under the influence of inertial forces.

Heat evolved during the generation of X-rays within the tube 10 as shown in FIG. 5 is conducted to the heat-accumulator 47 and thence to the fins 23 positioned radially surrounding the shaft 19 and heat-accumulator 47. The fins 23 may be made from pyrolytic graphite which is typically orientated in a plane perpendicular to a longitudinal axis of the shaft 19 and the heat-accumulator 47. The fins 23 are separated by a plurality of spacers 48. The spacers are typically formed from oriented pyrolytic graphite, although other conductive metals and carbonaceous materials compatible with service interior to the X-ray tube 10 may be employed.

In FIG. 5, the fins 23 and the spacers 48 are adhered one to the next and are adheringly joined to the target track assembly 15. Adhesives may also be employed to adhere the fins 23 and the spacers 48 to the heat-accumulator 47.

A plurality of pins 49 may be employed in the embodiment of FIG. 5 to align the spacers 48 and fins and to assist in coadhering the spacers and fins 23 into an integrated finned cooling assembly. The pins 49 may be formed of suitable or conventional materials; so-called AXF-5Q POCO graphite available from Union Oil Company has been found particularly suitable in the practice of the invention.

The fins 23 in the embodiment of FIG. 5 may be etched and/or carbon impregnated and then etched in accordance with this invention. Particularly, it is important that end portions 50 of the fins 23 and A-B plane surface portions in general be possessed of a relatively elevated surface emissivity as the primary point of heat rejection for the X-ray tube 10 as shown in FIG. 5, is the outer peripheral edge 50 of the fins 23. Typically the X-ray tube 10 of FIG. 5 would be surrounded by an oil bath (not shown) including a dielectric oil susceptible to acceptance of heat radiated from the outer edges 50 of the fins 23.

Referring to the drawings, FIG. 6 depicts an equally preferred embodiment of an X-ray tube 10 having a cathode support 12 and a cathode 11 enclosed within an envelope 32. A shaft 19 sealingly penetrates the envelope and is at least partially surroundingly topped by a shaft insulator sleeve 44. The shaft insulator sleeve 44 can be attached to the shaft using any suitable or conventional means or method such as by screw threading or by employing adhesives.

A target track assembly 15 including a target 16 and a track 17 is affixed to the shaft insulator sleeve 44, again employing any suitable or conventional means such as screw threading, adhesives, and the like. The target 16 is formed of pyrolytic graphite. The pyrolytic graphite includes a vapor deposited rhenium-tungsten deposited metal surface track 17. The pyrolytic graphite target 16 is etched to enhance heat radiation.

In the embodiment of FIG. 6, a plurality of fins 23 radially surround the shaft 19 adjacent the target track assembly 15. The fins 23 are spaced one from the next by a plurality of spacers 48. The fins 23 and spacers 48 are formed from pyrolytic graphite. Particularly, edge portion 50 of the fins 23 may be etched to provide an elevated surface emissivity. As shown in FIG. 6, one or more pins 49 function to retain the fins 23 and spacers 48 to the target track assembly 15. Such retention may also be facilitated by adhesive applied between the fins 23 and the spacers 48 and/or by affixing a plurality of co-adhered fins 23 and spacers 48 employing screw threading engaging screw threading formed upon the shaft insulator sleeve 44. Alternately, an adhesive may be employed for innerconnecting the fins 23 and spacers 48 with the shaft insulator sleeve 44.

In the preferred embodiment of FIG. 6, a plurality of second fins 27 are joined to a heat-acceptor 28 the second fins 27 extending therethrough into a reservoir 36 of dielectric cooling oil. The second fins 27 protrude through the envelope 32. The fins 27 are interleaved between the fins 23 with a relatively close tolerance of approximately 0.010 centimeters being provided between the interleaved fins 23, 27. A seal 52 is provided to seal the passage of the fins 27 from a point 33 inside the X-ray tube to a point external to the X-ray tube. Such seals are well known in the art of glass vacuum tube formation. The fins 27 may be formed from a heat conducting metal compatible with the construction and operation of X-ray tubes such as copper or beryllium or may be formed from carbonaceous materials such as graphite and pyrolytic graphite. The fins 27 function to receive heat radiated from the fins 23 and to conduct the heat to the oil reservoir 36. Where the fins 27 and the fins 23 are interleaved, surfaces of the fins 23 opposing fins 27 may be CVD graphite infiltrated in accordance with the instant invention and then etched to enhance surface emissivity.

In FIG. 6, the graphite forming the fins 23 and spacers 48 is configured to provide an A-B direction as shown by arrows designated by the reference numerals 39 and 40 to enhance the conductance of heat away from the target 16 and into the fins 23 for radiation. A-B orientation in the target 16 typically should be configured radially from a longitudinal axis of the shaft 19 so as to enhance heat conduction away from the track 17.

Insulator sleeves 44 such as are shown in FIGS. 3–6 typically can be formed from boron nitride or other suitable or conventional dielectric refractory material having elevated resistance to the transfer of heat.

It should be understood that the target 16 in any of FIGS. 1–6 can be formed from fine-grained bulk or pyrolytic graphite in lieu of TZM alloy. Pyrolytic graphite offers excellent heat conductivity properties and can be treated to provide an elevated surface emissivity substantially exceeding that of a TZM alloy. Additionally, employing of pyrolytic graphite for forming the target eliminates the somewhat onerous task of brazing a carbonaceous heat-pad 21 to a TZM target so as to facilitate the transfer and radiation of heat.

While a preferred embodiment of the invention has been shown and described in detail, it should be apparent that various modifications and alterations can be made thereto without departing from the scope of the claims that follow.

What is claimed is:

1. A fin configured for heat radiation in an X-ray tube formed from at least one of bulk and pyrolytic graphite and having surface portions having enhanced surface emissivity imparted by ion bombardment of the surface by a stream of ions at an intensity and of a duration sufficient to impart a closed surface emittance to the bombarded surface portions of at least 0.90.

* * * * *